US012787864B2

(12) United States Patent
Tang et al.

(10) Patent No.: US 12,787,864 B2
(45) Date of Patent: Nov. 3, 2026

(54) GRID-BASED INTERCONNECT SYSTEM FOR MODULAR INTEGRATED CIRCUIT SYSTEMS

(71) Applicant: Altera Corporation, San Jose, CA (US)

(72) Inventors: Lai Guan Tang, Tanjung Bungah (MY); Ankireddy Nalamalpu, Portland, OR (US); Mahesh K. Kumashikar, Bangalore (IN); Atul Maheshwari, Portland, OR (US)

(73) Assignee: Altera Corporation, San Jose, CA (US)

(*) Notice: Subject to any disclaimer, the term of this patent is extended or adjusted under 35 U.S.C. 154(b) by 453 days.

(21) Appl. No.: 17/856,193

(22) Filed: Jul. 1, 2022

(65) Prior Publication Data

US 2022/0336415 A1 Oct. 20, 2022

(51) Int. Cl.

*H10W 90/00* (2026.01)
*H10W 20/20* (2026.01)
*H10W 72/20* (2026.01)
*H10W 72/00* (2026.01)

(52) U.S. Cl.

CPC ........... *H10W 90/00* (2026.01); *H10W 20/20* (2026.01); *H10W 72/20* (2026.01); *H10W 72/877* (2026.01); *H10W 90/734* (2026.01)

(58) Field of Classification Search

CPC ... H01L 25/0652; H01L 23/481; H01L 24/16; H01L 24/32; H01L 24/73; H10W 90/00; H10W 20/20; H10W 72/20

See application file for complete search history.

(56) References Cited

U.S. PATENT DOCUMENTS

2021/0313988 A1* 10/2021 Weber ................. H01L 25/0657
2022/0189934 A1* 6/2022 Kim .................... H01L 25/0655

* cited by examiner

*Primary Examiner* — Eugene Lee
(74) *Attorney, Agent, or Firm* — Fletcher Yoder, PC

(57) ABSTRACT

Systems and methods are provided for a modular die-to-die interconnect for integrated circuits in a three-dimensional arrangement. An integrated circuit system may include a first chiplet that includes a grid-based interconnect field and a second chiplet that includes a complementary grid-based interconnect field. A number of interconnects of the complementary grid-based interconnect field of the second chiplet are connected to a corresponding number of interconnects of the grid-based interconnect field of the first chiplet.

21 Claims, 8 Drawing Sheets

GRID-BASED INTERCONNECT SYSTEM FOR MODULAR INTEGRATED CIRCUIT SYSTEMS

BACKGROUND

The present disclosure relates generally to integrated circuit systems, such as programmable logic devices. More particularly, the present disclosure relates to a grid-based interconnect system to enable a highly customizable modular integrated circuit system.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit systems are found in numerous electronic devices, including handheld devices, computers, gaming systems, robotic devices, automobiles, and more. Different types of devices may cater to different types of use cases; as such, more and/or different integrated circuit systems may be involved the different devices to meet the different specifications of the different use cases. In an effort to meet the variety of different use cases, various circuit components may be monolithically designed to be embedded within an integrated circuit system. For example, a programmable logic device may include programmable logic fabric (e.g., logic array blocks (LABs) or configurable logic blocks (CLBs), routing circuitry), embedded memory, embedded digital signal processing (DSP) circuitry, hardened processors, and the like. To meet the specifications of many different use cases, there may be many different monolithic integrated circuit designs. Moreover, these monolithic integrated circuit designs may include many redundant components to be able to be used in multiple different use cases to justify designing another monolithic integrated circuit.

Furthermore, the integrated circuit may be used in an integrated circuit system that may communicate with the other integrated circuits via a bridge or interposer. The circuit components to communicate between the integrated circuits may be placed in shorelines of the integrated circuits. The circuit components may communicate through bonding wires or solder bumps. However, the placement of these circuit components in the shoreline may cause routing congestion or bandwidth distribution issues within the main fabric die. Furthermore, the placement of these circuit components may also cause thermal dissipation issues since the circuit components of the integrated circuits may give off heat in operation.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
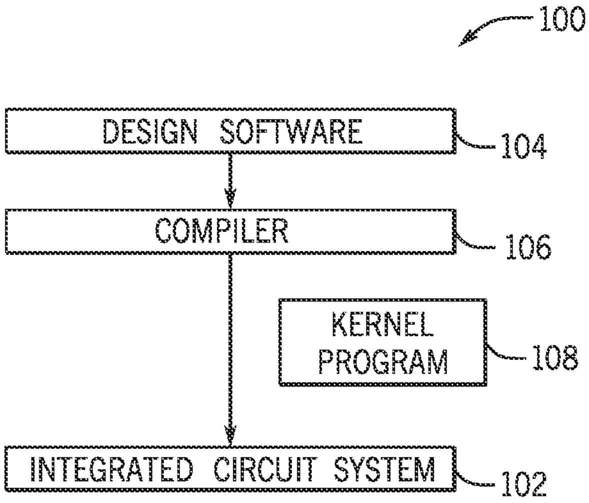
FIG. 1 is a block diagram of a process for implementing a system design on an integrated circuit system, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure describes systems and techniques related to creating modular integrated circuit systems. Any suitable integrated circuit systems may be formed by disaggregating components of a monolithic integrated circuit into chiplets that may be coupled in a three-dimensional (3D) or side-by-side (2.5D) arrangement. Although this disclosure encompasses any suitable integrated circuit systems, some specific examples of modular integrated circuit systems in the form of programmable logic devices will be discussed below. It should be appreciated that these examples are meant to be elucidatory and not exhaustive. For example, a programmable logic integrated circuit system may be formed by disaggregating one or more components of a field programmable gate array (FPGA). The integrated circuit system may include chiplets (e.g., separate dies, tiles) that respectively contain specific circuits that historically have been part of a monolithic programmable logic device.

The integrated circuit system may have a main fabric die (e.g., FPGA die) with a fabric embedded with certain common functions used by broad segments of potential developers or users that may couple to chiplets with supporting circuitry (e.g., disaggregated circuit elements). Indeed, the main fabric die may include programmable logic circuitry, which may be referred to as logic array blocks (LABs) or configurable logic blocks (CLBs), and programmable routing circuitry. In some cases, the main fabric die may not include certain other circuit elements found in many monolithic programmable logic devices, such as embedded memory (e.g., M20k) blocks, digital signal processor (DSP) blocks, embedded input/output (IO), embedded hard processor systems (HPS), or the like. In some cases, the disaggregated circuitry may be referred to as FPGA memory, FPGA DSP blocks, FGPA IO blocks, and FPGA HPS blocks, or the like, to signify that they represent circuitry suitable for use by an FPGA like circuitry that is found in a monolithic FPGA. Moreover, these disaggregated components may be disposed in separate respective chiplets (e.g., there may be separate memory chiplets, DSP chiplets, IO chiplets, HPS chiplets) or may be at least partly combined in certain chiplets (e.g., there may be chiplets with both memory and DSP blocks, chiplets with IO chiplets and HPS). Disaggregating these circuit components may cause the FPGA die to use less power to operate or operate more efficiently since the programmable logic fabric may be arranged as a continuous array. Indeed, a continuous array of programmable logic fabric may be a more efficient power and performance arrangement.

Additionally or alternatively, the chiplets (including the main fabric die) may have a specific interface with one or more microbumps or hybrid bonds that receive (e.g., snap) one or more chiplets at multiple locations along the interface. For example, the one or more chiplets may implement fixed-function logic found in monolithic FPGAs, such as floating point (FP) arithmetic, a cryptographic engine, an artificial intelligence (AI) engine, or the like. The chiplets may also implement functions for off-die communication, such as functions of communication ports, input/output ports, bridges or interposers, decoupling capacitors, or the like. The chiplets may further implement processes of hardened circuits, such as processors (e.g., an x86 processor, an Advanced RISC Machines (ARM) processor, a secure device manager (SDM)), hard processor system (HPS), or the like). The chiplets may also implement voltage regulation (VR), a power source, or the like. Accordingly, the integrated circuit system may be created by "snapping" the chiplets to the interface of the substrate.

In an example, a market segment or a customer may want an integrated circuit system with to with a certain functionality or performance requirements. The integrated circuit system may be quickly and efficiently developed by "snapping" one or more chiplets that implement a desired function in a desired arrangement to the interface of the substrate. The resulting integrated circuit system may meet the desires of the market due to the arrangement of the chiplets and/or the functionality of the chiplets. For example, the relative placement of the chiplets may be selected based on an expected FPGA system design that will be configured on the programmable fabric die. The relative placement of the chiplets may also be selected so as to distribute heat based on an expected operation of the FPGA system design. Accordingly, the time to develop and bring the integrated circuit system to the market segment or customer may be shortened.

With the foregoing in mind, an integrated circuit system according to this disclosure may take any suitable form. One example is that of a programmable logic device that includes programmable logic circuitry (e.g., programmable logic fabric, FPGA programmable logic). FIG. 1 illustrates a block diagram of a system 100 used to design and/or configure an integrated circuit device (e.g., a programmable logic device, an application specific integrated circuit (ASIC)). A designer may implement functionality on an integrated circuit, such as an integrated circuit system 102 that includes some reconfigurable circuitry, such as an FPGA. A designer may implement a circuit design to be programmed onto the integrated circuit system 102 using design software 104, such as a version of QUARTUS® by INTEL CORPORATION. The design software 104 may use a compiler 106 to generate a low-level circuit design, which may be provided as a kernel program 108, sometimes known as a program object file or bitstream that programs the integrated circuit system 102. For example, the compiler 106 may provide machine-readable instructions representative of the circuit design to the integrated circuit system 102.

Figure 2:
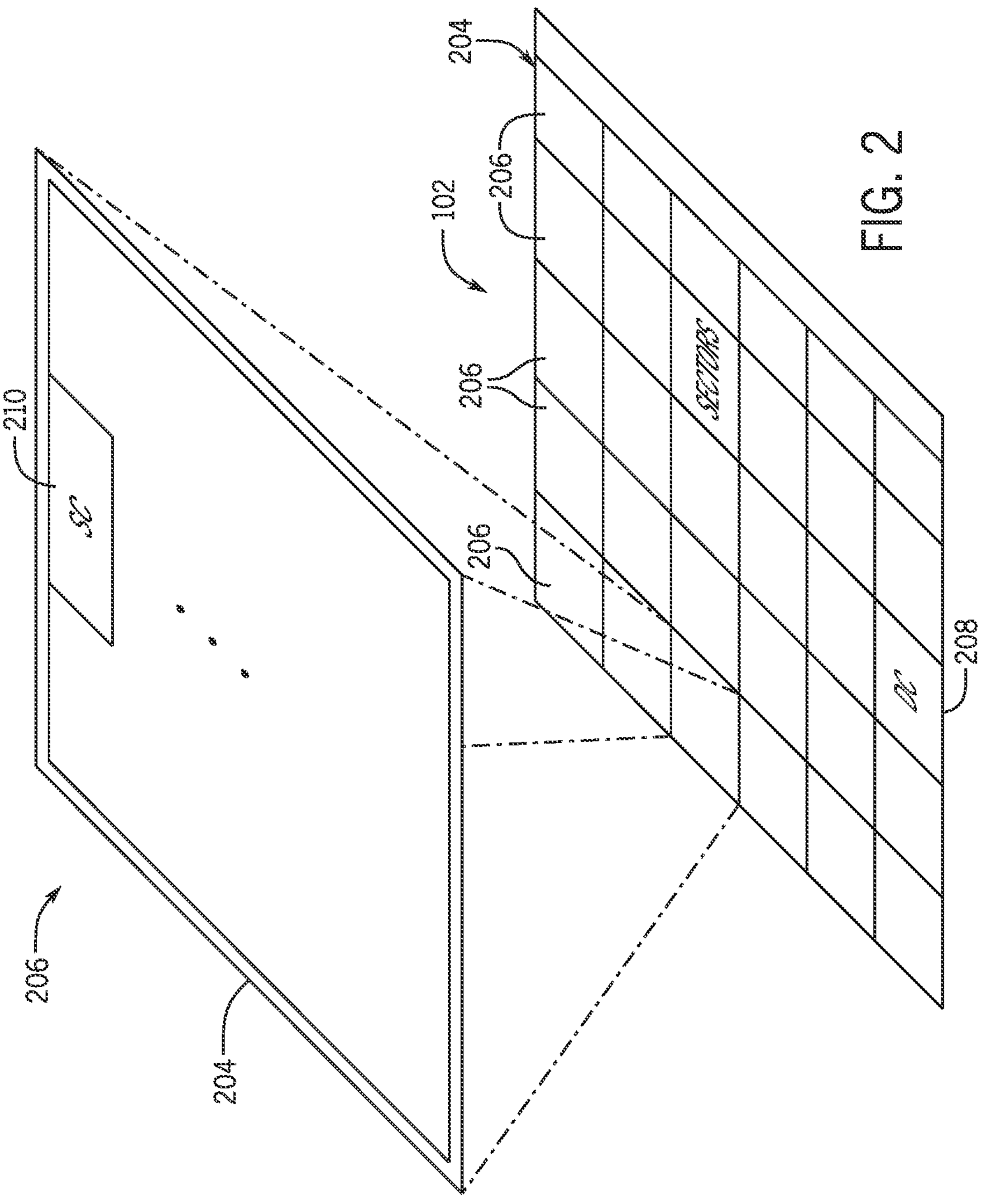
FIG. 2 is a block diagram of an example logical arrangement of the integrated circuit system in the form of a field programmable gate array (FPGA), in accordance with an embodiment of the present disclosure.

The integrated circuit system 102 may include any programmable logic device, such as a field programmable array (FPGA), as shown in FIG. 2. For the purposes of this example, the integrated circuit system 102 is referred to as a FPGA, though the device may be any suitable type of programmable logic device (e.g., an application-specific integrated circuit and/or application-specific standard product). The integrated circuit system 102 may be a three-dimensional FPGA having multiple chiplets with a variety of disaggregated FGPA circuitry. FIG. 2 specifically illustrates aspects of a programmable logic fabric chiplet, and other chiplets with other functionality will be described and shown in other figures.

In the example of FIG. 2, the integrated circuit system 102 may include interconnection resources 204 that may be used to route signals, such as clock or data signals, through the integrated circuit system 102. The integrated circuit system 102 of FIG. 2 is sectorized, meaning that programmable logic resources may be distributed through a number of discrete programmable logic sectors 206. Each programmable logic sector 206 may include a number of programmable logic elements having operations defined by configuration memory (e.g., configuration random access memory (CRAM)). The programmable logic elements may include combinational or sequential logic circuitry. For example, the programmable logic elements may include look-up tables, registers, multiplexers, routing wires, and so forth. A designer may program the programmable logic elements to perform a variety of desired functions.

There may be any suitable number of programmable logic sectors 206 on the integrated circuit system 102. Indeed, while 29 programmable logic sectors 206 are shown here, it should be appreciated that more or fewer may appear in an actual implementation (e.g., in some cases, on the order of 1, 5, 10, 50, 100, 500, 1000, 5000, 10,000, 50,000, or 100,000 sectors or more). Each programmable logic sector 206 may include a sector controller (SC) 210 that controls the operation of the programmable logic sector 206. Each sector controller 210 may be in communication with a device controller (DC) 208, which may be disaggregated onto a separate chiplet in other examples. Each sector controller 210 may accept commands and data from the device controller 208 and may read data from and write data into its configuration memory based on control signals from the device controller 208. In addition to these operations, the sector controller 210 may be augmented with numerous additional capabilities. For example, such capabilities may include locally sequencing reads and writes to implement error detection and correction on the configuration memory and sequencing test control signals to effect various test modes.

The sector controllers 210 and the device controller 208 may be implemented as state machines and/or processors. For example, each operation of the sector controllers 210 or the device controller 208 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 206. This may provide usable extensibility in an efficient and easily understood way. This may be useful because new commands could bring about large amounts of local activity within the sector at the expense of only a small amount of communication between the device controller 208 and the sector controllers 210.

Each sector controller 210 thus may communicate with the device controller 208, which may coordinate the operations of the sector controllers 210 and convey commands initiated from outside the integrated circuit system 102. To support this communication, the interconnection resources 204 may act as a network between the device controller 208 and each sector controller 210. The interconnection resources 204 may support a wide variety of signals between the device controller 208 and each sector controller 210. In one example, these signals may be transmitted as communication packets.

The programmable logic fabric of the integrated circuit system 102 may be electrically programmed. With electrical programming arrangements, the programmable elements may include one or more logic elements (wires, gates, registers, etc.). For example, during programming, configuration data is loaded into the configuration memory using pins and input/output circuitry. In one example, the configuration memory may be implemented as configuration random-access-memory (CRAM) cells. As discussed below, in some embodiments, the configuration data may be loaded into the integrated circuit system 102 using an update to microcode of a processor in which the integrated circuit system 102 is embedded. The use of configuration memory based on RAM technology is described herein is intended to be only one example. Indeed, in other examples, the integrated circuit system 102 may include structured ASIC circuitry (e.g., eASIC™ structured ASIC circuitry by INTEL CORPORATION). Structured ASIC circuitry is a type of via-configurable circuitry similar to FPGA circuitry that can be programmed by selectively filling via sites during the manufacture of the structured ASIC die. Moreover, configuration memory may be distributed (e.g., as configuration RAM cells) throughout the various programmable logic sectors 206. The configuration memory may provide a corresponding static control output signal that controls the state of an associated programmable logic element or programmable component of the interconnection resources 204. The output signals of the configuration memory may be applied to the gates of metal-oxide-semiconductor (MOS) transistors that control the states of the programmable logic elements, or programmable components of the interconnection resources 204.

Figure 3:
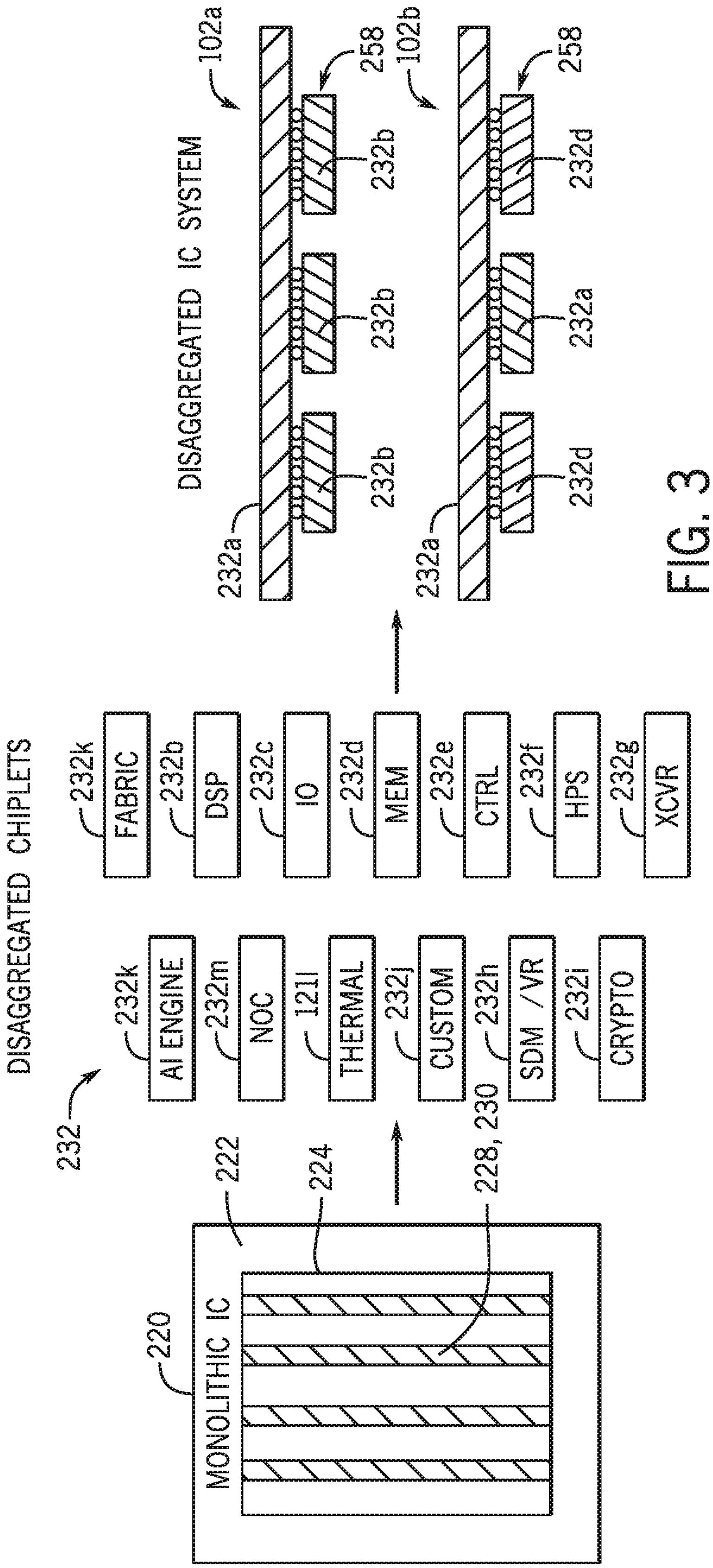
FIG. 3 illustrates examples of an integrated circuit system in the form of the FPGA, formed from components disaggregated from a monolithic FPGA, in accordance with an embodiment of the present disclosure.

The integrated circuit system 102 may be formed by combining selected chiplet(s) 232 (e.g., separate dies, tiles) that may respectively have circuitry to implement one or more function(s) of the integrated circuit system 102. As shown in FIG. 3, the chiplets 232 may have respective circuit elements corresponding to circuit elements that have been disaggregated from a monolithic FPGA 220. Such circuit elements that may be found in a monolithic FPGA 220 include fixed-function logic such as input/output (IO) ports 222, fabric 224, a memory 228, and a digital signal processor (DSP) 230, which in a monolithic FPGA 220 may be tightly coupled with the programmable fabric 224. This may slow a maximum processing speed of such a monolithic FPGA 220 in the case of embedded circuit elements or may constrain bandwidth in the case of elements solely distributed along the shoreline.

This fixed-function logic may be disaggregated from the programmable logic fabric, meaning the fixed-function logic may be decoupled from the programmable logic fabric and made into separate chiplets 232 (e.g., separate die) that can be attached to one another in a 3-dimensional (3D) arrangement. In the illustrated embodiments, the chiplets 232 may implement one or more desired fixed-function logic of the integrated circuit system 102. A few non-limiting examples of the type of fixed-function logic that may be disaggregated into individual chiplets 232 include a fabric chiplet **232*a*, a DSP chiplet 232*b*, an IO chiplet 232*c*, and a memory chiplet 232*d*. For example, the fabric chiplet 232*a* may be configured to implement any suitable functions of the fabric 224. The DSP chiplet 232*b* may be implement functions of the DSP 230, such as to accelerate certain functions or processes or perform FP arithmetic. The IO chiplet 232*c* may implement functions of the IO ports 222 for off-die communication. The memory 232*d* may operate as the memory 228** to store data locally.

There may be a variety of other suitable circuitry that may be disaggregated into different chiplets 232. As noted above, the following examples are intended to be illustrative and not exclusive. A device control (CTRL) chiplet **232*e* may represent an example of a device controller (DC) 208, sector controller 210, or other control circuitry to control operations of the integrated circuit system 102. A hard processor system (HPS) chiplet 232*f* may include any suitable processor or set of processors (e.g., an x86 processor, an Advanced RISC Machines (ARM) processor) and/or associated memory that may implement functions of an HPS of a monolithic FPGA. The HPS chiplet 232*f* may allow disaggregation over any suitable protocol, such as universal interface bus (UIB), Advanced Interface Bus (AIB), or Advanced eXtensible Interface (AXI). This may also allow for different HPS instruction set architectures (ISAs) for different use cases (e.g., Intel 64, IA-32, ARM). Moreover, numerous HPS chiplets 232*f* may be included for use cases such as for infrastructure processing units (IPUs). A transceiver (XCVR) chiplet 232*g* may receive or transmit analog or digital signals out to other electronic devices (e.g., on a network). For example, the XCVR chiplet 232***g* may represent any suitable high-speed serial interconnect (HSSI) and may receive or transmit signals over metal wires, wirelessly via an antenna, or optically via a fiber optic cable. In some cases, the XCVR chiplet 232*g* may be further disaggregated to include only transmitter circuitry or only receiver circuitry, taking up less space and/or consuming less power. A secure device manager/voltage regulator (SDM/VR) chiplet 232*h* may represent a disaggregated device controller (e.g., a disaggregated version of the device controller 208 shown in FIG. 2) that may control the operation of the integrated circuit system 102 and regulate and/or provide power. Indeed, in some cases, the fabric chiplets 232*a* may not include any on-die voltage regulators but may receive regulated voltage from a disaggregated VR chiplet 232, such as an SDM/VR chiplet 232*h*. The SDM/VR chiplet 232*h* may also be further disaggregated into two separate chiplets that implement the functions of a device controller and functions of voltage regulation, respectively. A crypto chiplet 232*i* may provide any suitable encryption and/or decryption acceleration for the integrated circuit system 102 (e.g., to provide encryption or decryption on demand, to provide always-on encryption, to decrypt or authenticate a configuration bitstream before it is programmed into a fabric chiplet 232*a*). Further, a customized chiplet 232*j* may represent any suitable circuitry that may be designed by a customer or that may be designed according to a customer specification. An AI engine chiplet 232*k* may include any suitable circuitry to perform machine learning (ML) techniques (e.g., a hardened accelerator for matrix multiplication, a systolic array of processing elements). A thermal chiplet 232*l* may be used for thermal dissipation. A network-on-chip (NOC) chiplet 232*m* may be used to provide packetized data transfer from one part of a different chiplet 232 to another part of the same chiplet 232 or to another chiplet 232. To emphasize, the various chiplets 232 listed above are intended to be examples and are not an exhaustive list. Any suitable circuit elements that perform functions (e.g., discrete functions, groups of functions) may be used. For example, the chiplets 232 may have any circuitry that performs a function found in monolithic FPGAs, supports an FPGA, supports a processor (e.g., central processing unit (CPU) or graphics processing unit (GPU), or provides any suitable functionality on a separate chiplet 232.

The integrated circuit system 102 may be created by mounting one or more chiplets 232 together using microbumps 258 or hybrid bonds. A surface of the chiplets 232 may include die-to-die (D2D) interconnects that can be "snapped" to microbumps 258 or hybrid bonds to connect to corresponding die-to-die interconnects on another chiplet 232. An example of a die-to-die interconnect field that can connect multiple different chiplets in multiple different configurations will be discussed with reference to FIGS. 7 and 8 below.

By combining various chiplets 232 of various disaggregated FPGA components, a vast variety of possible integrated circuit systems 102 may be made. The combination of chiplets 232 may be selected to be specific to particular use cases in mind for that integrated circuit system 102. Indeed, in this way, integrated circuit systems 102 may be highly customizable. Indeed, different FPGA use cases may use more or fewer of different types of resources. Some FPGA user designs may use significant in-system memory but few DSP resources, while others may use significant DSP resources but little memory resources. The disaggregation of FPGA components may allow a user to obtain a custom integrated circuit system 102 that is tailored to a particular use case. What is more, as will be discussed further below, the die-to-die interconnect field of this disclosure may allow for the customized placement of the chiplets 232 into different positions with respect to one another. This means that specific FPGA support resources such as DSP or memory resources may be positioned near to areas of programmable logic fabric resources on which system designs will be configured. The great customizability of the disclosed approach may allow for tremendous customization.

Figure 4:
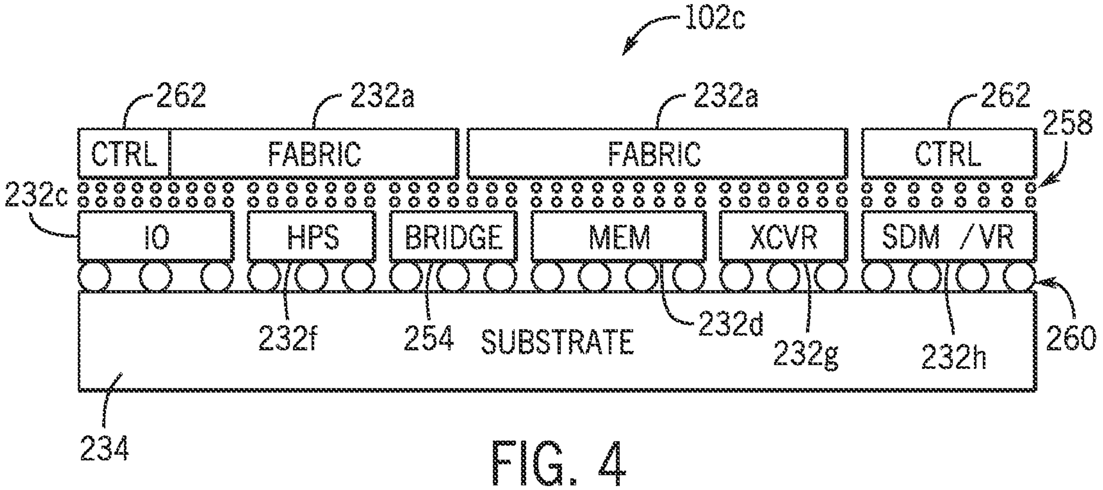
FIG. 4 is side view of a block diagram of one example of the integrated circuit system, in accordance with an embodiment of the present disclosure.
Figure 5:
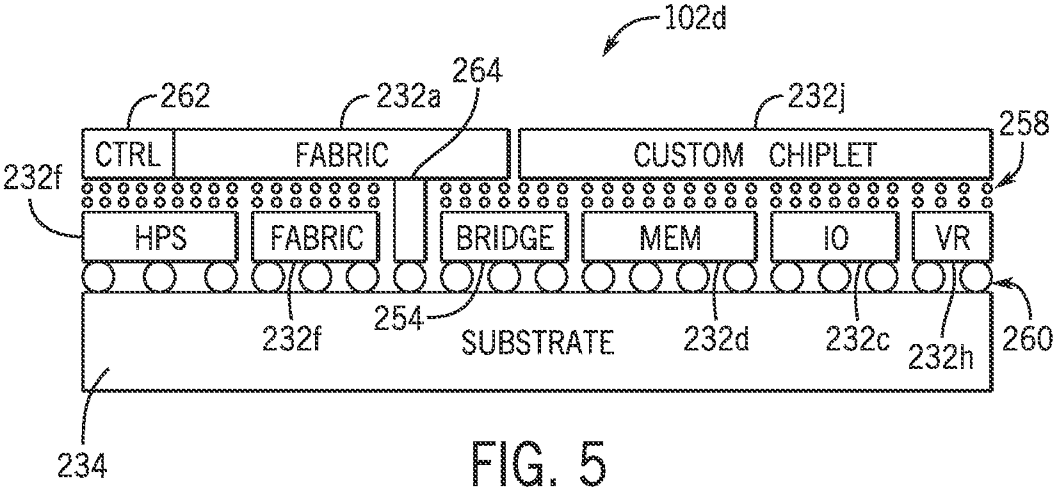
FIG. 5 is side view of a block diagram of another example of the integrated circuit system, in accordance with an embodiment of the present disclosure.

Several examples of custom integrated circuit systems 102 are shown in FIGS. 3, 4, and 5. In a first example shown in FIG. 3, an integrated circuit system 102*a* includes a programmable fabric chiplet 232*a* that acts as a larger, main die coupled to multiple smaller DSP chiplets 232*b*. An integrated circuit system 102*b* is also shown that includes a programmable fabric chiplet 232*a* that acts as a main die coupled to another, smaller programmable fabric chiplet 232*a* and two memory chiplets 232*d*. In this way, a built-for-purpose integrated circuit system 102 may be manufactured that includes resources (e.g., certain FPGA resources) for a particular use case and may not include resources (e.g., other FPGA resources) not for that particular use case.

In certain embodiments, the integrated circuit system 102 may include disaggregated FPGA resources connected using a bridge with TSV or a passive interposer for fabric-to-fabric communication. In the example of FIG. 4, an integrated circuit system 102*c* may include one or more chiplets 232, a substrate 234, and a bridge 254. The substrate 234 supports the chiplets 232 and enables the chiplets 232 to communicate outside of the package of the integrated circuit system 102*c*. For example, the integrated circuit system 102 may communicate with a network interface, a central processing unit, a graphics processing unit, memory or storage devices, or the like.

Fabric chiplets 232*a* may serve as main fabric dies, which may be patterned with a die-to-die grid of interfaces for microbumps 258 or hybrid bonds. Other chiplets 232 may have a corresponding die-to-die grid of interfaces for the microbumps 258 or hybrid bonds to interface with the main fabric die chiplets 232*a*. The microbumps 258 or hybrid bonds may have any suitable size smaller than C4 bumps to enable sufficient communication between dies. Lower chiplets 232 may couple to the substrate 234 with microbumps, hybrid bonds, or larger bumps (e.g., C4 bumps 260). For example, the first layer of chiplets 232 may have microbumps 258 on a surface of the chiplet 232 that connects with microbumps 258 on another surface of a chiplet 232 of the second layer of chiplets 232. Additionally or alternatively, bumps such as controlled collapse chip connection (C4) bumps 260 (sometimes referred to as flip-chip bumps) may be formed at a surface of the chiplets 232 and a top surface of the substrate 234. Generally, C4 bumps 260 (e.g., bumps used for interfacing with off-package components) are substantially larger than in size compared to microbumps 258 or hybrid bonds (e.g., bumps or bonds used for interfacing with other chiplets within the same chiplet package). The number of microbumps 258 or hybrid bonds is also generally much greater than the number of C4 bumps 260 (e.g., the ratio of the number of microbumps 258 or hybrid bonds to the number of C4 bumps 260 may be greater than 2:1, 5:1, 10:1, 100:1, 1000:1, 10,000:1, 100,000:1, and so forth).

In the example of FIG. 4, the integrated circuit system 102*c* includes a first layer of chiplets 232 mounted on the substrate 234 and a second layer of chiplets 232 mounted on the first layer of chiplets 232. There may be further layers of chiplets 232 in other examples. In this example, the first layer of chiplets 232 includes the IO chiplet 232*c*, the HPS chiplet 232*f*, the memory chiplet 232*d*, the XCVR chiplet 232*g*, and the SDM chiplet 232*h*. The second layer of chiplets 232 may include the two fabric chiplets 232*a*, which may include control circuitry (CTRL) 262 that may interface with the SDM chiplet 232*h* and/or the IO chiplet 232*c*. In the illustrated example, the bridge 254 may facilitate signal transfer (e.g., die-to-die communication) between the two fabric chiplets 232*a*. By way of example, the bridge 254 may operate in the manner of an Embedded Multi-Die Interconnect Bridge (EMIB) by Intel Corporation. In general, any suitable number and arrangement of chiplets 232 may be mounted on the substrate 234 and/or a layer of chiplets 232 above the substrate 234.

Another example is shown in FIG. 5. Here, an integrated circuit system 102*d* may include two fabric chiplets 232 that may be stacked to provide higher programmable capacity in a small form factor. In the example of FIG. 5, the integrated circuit system 102*d* may include a first layer of chiplets 232 that may include a hard processor system (HPS) 232*f*, a first fabric chiplet 232*a*, a bridge 254, a memory chiplet 232*d*, an IO chiplet 232*c*, and a voltage regulator (VR) chiplet 232*h* mounted on top of the substrate 234. A second layer of chiplets 232 may be mounted above the first layer of chiplets 232, including a second fabric chiplet 232*a* mounted on top of the HPS chiplet 232*f*, the first fabric chiplet 232*a*, and the bridge 254. The second fabric chiplet 232*a* may also include control circuitry (CTRL) 262 that may communicate with the HPS chiplet 232*f*. A copper pillar 264 may enable a second-layer fabric chiplet 232 (e.g., the second-layer fabric chiplet 232*a*) to communicate out of the package to one or more C4 bumps 260. The second-layer fabric chiplet 232*a* may also connect for die-to-die communication with a custom chiplet 232*j* via the bridge 254. The custom chiplet 232*j* is shown here connected to the memory chiplet 232*d*, the IO chiplet 232*c*, and the voltage regulator (VR) chiplet 232*h*. While two stacks high are shown, the chiplets 232 may be arranged in multi-high stacks (e.g., three, four, five, or higher stacks of chiplets 232).

The techniques and improvements described herein may be applied not only to stacking one or more fabric chiplets, but also extended to transceiver chiplets, networking adaptor chiplets, discrete components, configuration devices, debugging chiplets, and/or other types of storage and processing components within the integrated circuit system.

As mentioned above, products that may be suitable for one use case may be less suitable for other use cases. For example, some user designs may consume different types of resources (e.g., programmable logic fabric, DSP blocks, memory) in different amounts. Moreover, some user designs, when programmed into programmable logic fabric, may have different footprints that may generate different thermal profiles or use take up different input/output bandwidth. For example, a user design that generates heat in specific locations of programmable logic fabric may be well-suited for being programmed into programmable logic fabric of an integrated circuit system that includes additional thermal dissipation chiplets (or that does not include heat-producing chiplets) near those areas. In another example, a user design that performs a large amount of off-package communication may benefit from additional IO or transceiver resources. Disaggregating the various FPGA components may also avoid congested shoreline, as could arise in a monolithic FPGA. In sum, the examples of FIGS. 3, 4, and 5 are non-limiting examples of possible integrated circuit systems 102 that may be manufactured using chiplets 232 that include disaggregated circuitry found in monolithic integrated circuits, such as FPGAs. The arrangements for combining chiplets 232 may be done in a vast number of suitable ways.

Figure 6:
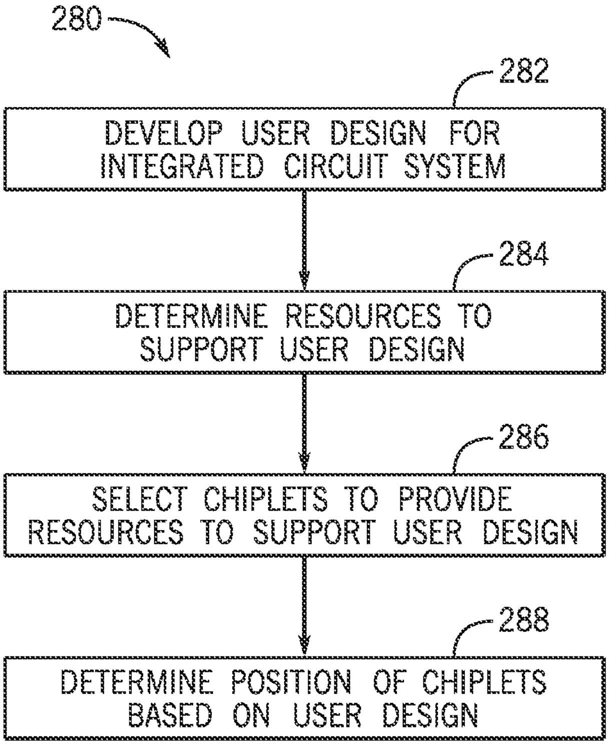
FIG. 6 is a flowchart of an example method for designing the integrated circuit system, in accordance with an embodiment of the present disclosure.

As shown by a flowchart 280 of FIG. 6, the selection and placement of the chiplets 232 may be done based on a user design for the programmable logic fabric of the integrated circuit system 102. A designer may develop a user design for an integrated circuit system 102 (block 282). For example, the designer may use design software such as Quartus® by Intel Corporation to develop the user design. The software may determine the resources involved to support the user design (block 284). For example, the software may identify the amount of programmable logic fabric to be used, the number of DSP blocks, the number of memory blocks, and the like. Based on the resources to be used by the user design, the software may select or recommend the type, size, number, and the like of the various chiplets 232 of which the integrated circuit system 102 may include to sufficiently support the user design (block 286). The software may also place and route the user design with the selected chiplets 232 in mind. This may entail determining the position of the chiplets 232 in relation to one another to accommodate the user design (block 288).

Figure 7:
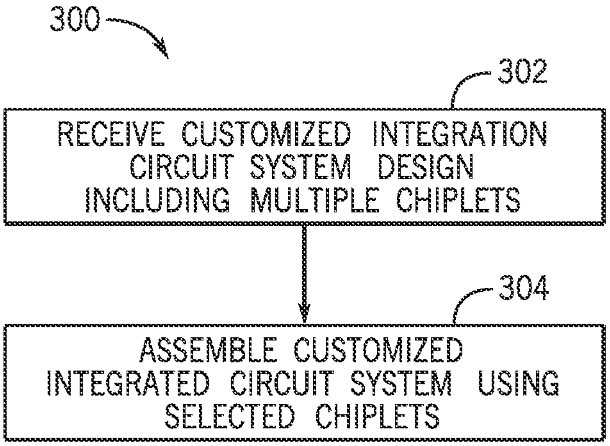
FIG. 7 is a flowchart of an example method for making and providing the integrated circuit system, in accordance with an embodiment of the present disclosure.

Whether the design is obtained in the manner of the flowchart 280 of FIG. 6 or by other techniques (e.g., manually), a flowchart 300 of FIG. 7 illustrates one manner in which the integrated circuit system 102 may be manufactured based on a custom integrated circuit system design. A manufacturer may receive a design for a customized integrated circuit system 102 from a customer (block 302). The design for the customized integrated circuit system 102 may be based on specifications particular to a user design (e.g., program 108, configuration bitstream) that is to be programmed into programmable logic fabric of the integrated circuit system 102. The manufacturer may assemble the customized integrated circuit system 102 using selected chiplets (block 304). In one example, a customer may specify a type of function or a desired function and the manufacturer may select appropriate chiplets and/or their location. For example, the customer may provide certain specifications from the user design that is expected to be programmed into programmable logic fabric of the integrated circuit system. The specifications may include, for example, bandwidth, power, accelerator functions, and programmable logic fabric specifications. In another example, the customer may provide a design that specifies the particular placement of different chiplets in relation to one another. The customer may further select a size of the substrate 234 and sizes of the chiplets 232 to meet their specifications. In another example, the market may demand an integrated circuit system 102 with certain properties or functions to meet the specifications of certain high-performance applications. For example, the chiplets 232 may be arranged in a symmetrical manner for improved bandwidth distribution and/or thermal dissipation.

Figure 8:
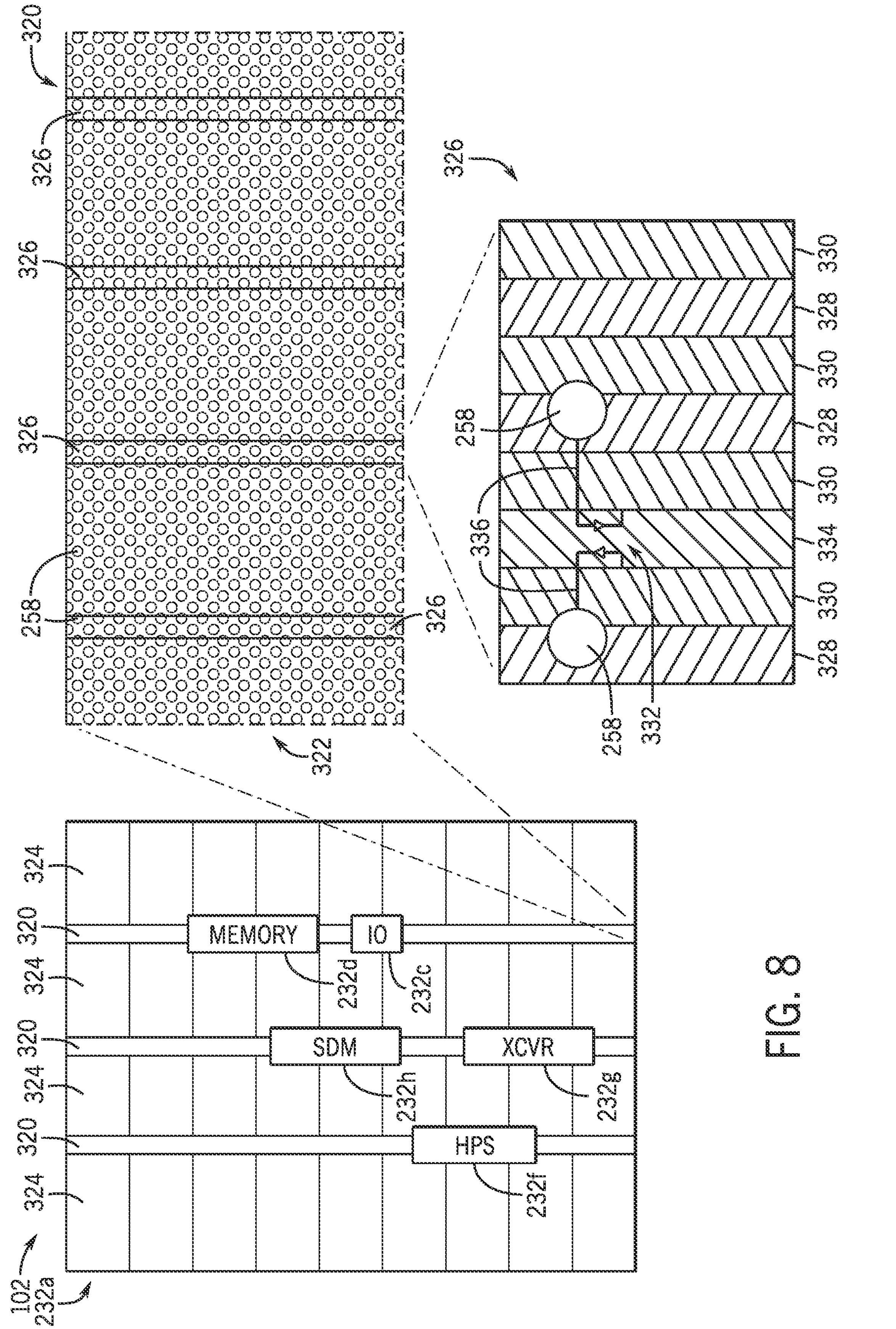
FIG. 8 is a block diagram of an example of the integrated circuit system showing chiplets connected via a vertically columnar grid-based interconnect system, in accordance with an embodiment of the present disclosure.

The position and arrangement of the chiplets 232 may be facilitated by a grid-based arrangement of interconnects to allow various chiplets 232 to "snap" to one another in die-to-die communication (e.g., a repeating pattern of interconnects). In an example, the FIG. 8 is block diagram of a large programmable logic fabric chiplet 232*a* that may be used in an integrated circuit system 102. The fabric chiplet 232*a* may include strips of die-to-die interconnects 320 by which other chiplets 232 (e.g., an HPS chiplet 232*f*, an SDM chiplet 232*h*, a transceiver chiplet 232*g*, a memory chiplet 232*d*, and an IO chiplet 232*c*) having corresponding die-to-die interconnects may connect to the fabric chiplet 232*a*. The corresponding die-to-die interconnects of other chiplets 232 may be complementary to that of the fabric chiplet 232*a* (e.g., a complementary repeating pattern of interconnects) or the corresponding die-to-die interconnects of other chiplets 232 may be unique to a particular chiplet 232 but may have one or more interconnects that align with interconnects of the grid-based arrangement of interconnects of the strips of die-to-die interconnects 320. The strips of die-to-die interconnects 320 may include a grid-based interconnect field 322 that may connect to an array of microbumps 258 or hybrid bonds. Although the strips of die-to-die interconnects 320 appear to be adjacent to the programmable logic circuitry 324 in FIG. 8, the strips of die-to-die interconnects 320 may be formed over the programmable logic circuitry 324. In other words, the programmable logic circuitry 324 continues beneath the strips of die-to-die interconnects 320. Where the strips of die-to-die interconnects 320 are shown in FIG. 8 is where the programmable logic circuitry 324 may have die-to-die communication with other chiplets 232 that are connected at the strips of die-to-die interconnects 320.

In the illustrated example, the strips of die-to-die interconnects 320 may have a vertical configuration, meaning that the strips of die-to-die interconnects 320 have die-to-die diffusion locations 326 in parallel with columns of programmable logic blocks 328 (e.g., logic array blocks (LABs), configurable logic blocks (CLBs)) and routing circuitry 330 of the programmable logic circuitry 324. Although the strips of die-to-die interconnects 320 are shown as strips that extend over certain areas of the programmable logic circuitry 324, there may be more or fewer. Indeed, in some examples, the die-to-die interconnects 320 may be disposed over all of the programmable logic circuitry 324 or over certain regions having shapes other than vertical strips.

The die-to-die diffusion locations 326 may include pairs of microbumps 258 or hybrid bonds that may respectively receive or transfer die-to-die signals with a corresponding interface on another chiplet 232. In the illustrated example, die-to-die driving circuitry 332 may be located in a comparatively small die-to-die IO region 334. That is, the die-to-die IO region 334 may be comparatively smaller than other circuitry that would be placed in between the routing circuitry 330 and the programmable logic blocks 328 in a monolithic die (e.g., DSP blocks, memory blocks, IO blocks, and the like). Indeed, in the disaggregated integrated circuit system 102, the die-to-die IO region 334 may take up significantly less space than specialized circuitry of the chiplets 232 (e.g., the IO circuitry of the IO chiplet 232*c* may take up much more space than the circuitry of the die-to-die IO region 334, the circuitry of the memory die 232*d* may take up much more space than the circuitry of the die-to-die IO region 334). Communication wires 336 may connect the respective microbumps 258 or hybrid bonds to the die-to-die driving circuitry 332, which in turn may connect to the routing circuitry 330. The routing circuitry 330 may route data between the programmable logic blocks 328 and the driving circuitry 332. The die-to-die driving circuitry 332 may include any suitable circuitry (e.g., amplifiers, multiplexers, buffers, registers) to drive signals from one die of the integrated circuit system 102 (e.g., the fabric die 232*a*) to another die of the integrated circuit system 102 (e.g., the IO die 232*c*). In some examples, the die-to-die driving circuitry 330 may include multiplexing circuitry to perform time division multiplexing to increase the bandwidth of the signals that may traverse the microbumps 258 or hybrid bonds.

As mentioned above, a surface of the chiplets 232 may be patterned with an array of microbumps 258 or hybrid bonds forming the grid-based interconnect field 322. Because there is a comparable grid-based interconnect field on the other chiplets 232, the chiplets 232 may "snap" into place in any suitable locations along the grid-based interconnect field 322. In this way, a designer may "slide" a chiplet 232 up or down the grid-based interconnected field 322 and "snap" two chiplets 232 together for die-to-die communication. For example, the memory chiplet 232*d* may be positioned higher or lower along the strip of die-to-die interconnects 320, or may be positioned along a different strip of die-to-die interconnects 320, and still have the same capability for die-to-die communication with the fabric chiplet 232*a*.

In this way, the positioning of the chiplets 232 may be selected based on any design criteria. In one example, the positioning may be determined based on the user design (e.g., program 108, configuration bitstream) that is to be programmed into the programmable logic fabric 324 of the integrated circuit system 102. In another example, the positioning of the chiplets 232 may be selected based on packaging considerations or space constraints of a housing of an electronic device into which the integrated circuit system 102 will be used. In other examples, the positioning of the chiplets 232 may be selected based on thermal profiles or bandwidth constraints. Due to the plug-and-play nature of the grid-based interconnect field 322, there are a vast array of possible arrangements that facilitate die-to-die communication among different chiplets 232. As such, the integrated circuit system 102 may be created with any number of chiplets 232 in any suitable configuration. Accordingly, the components of a monolithic FPGA may be moved from a shoreline of the integrated circuit system 102, allowing for more continuous fabric 224 of the integrated circuit system 102, more evenly distributed bandwidth into the fabric 224, increased efficiency, and decreased routing congestion. Additionally or alternatively, the modular design of the integrated circuit system 102 may allow for faster construction and reduced cost.

Figure 9:
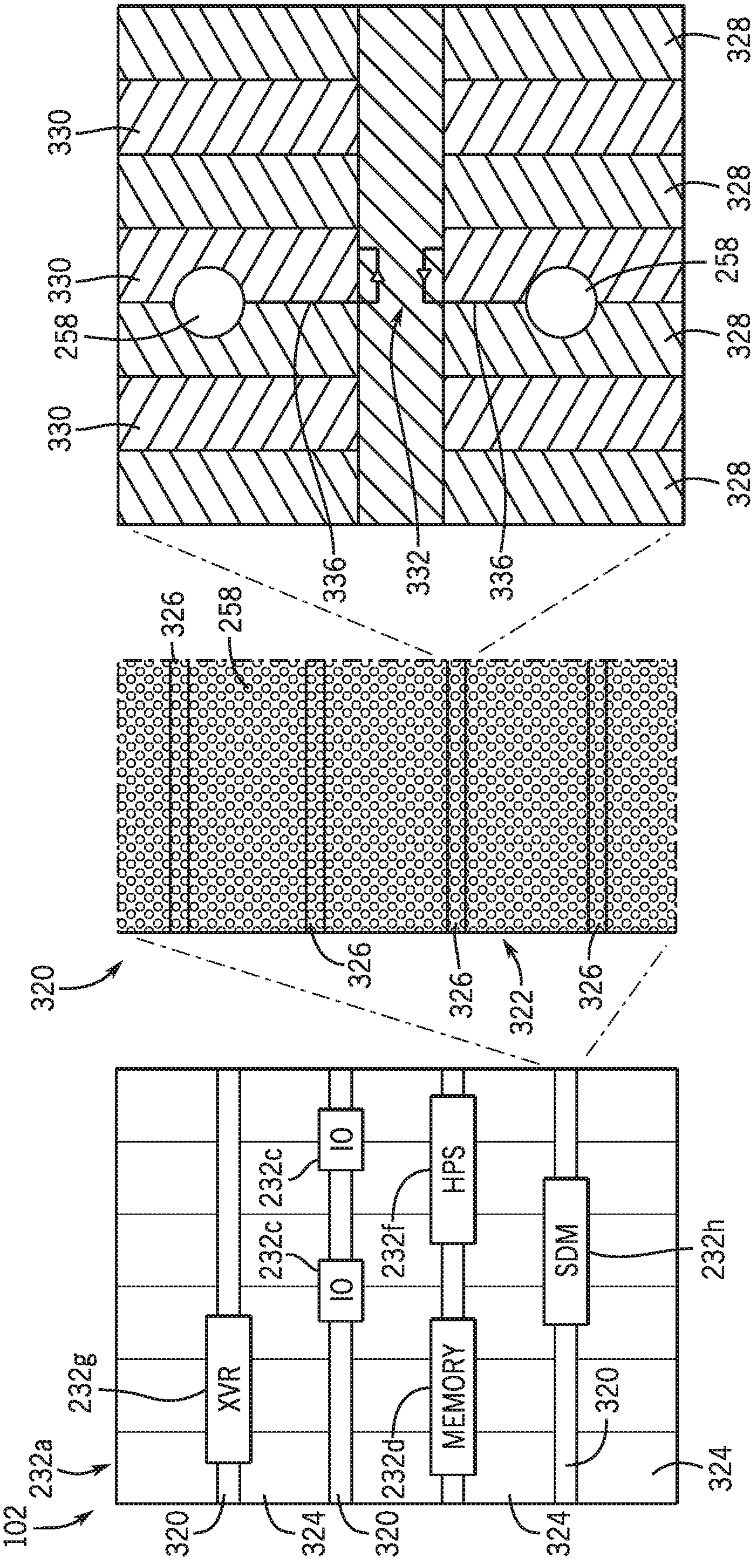
FIG. 9 is a block diagram of an example of the integrated circuit system showing chiplets connected via a horizontally columnar grid-based interconnect system, in accordance with an embodiment of the present disclosure.

In another example shown in FIG. 9, the strips of die-to-die interconnects 320 may have a horizontal configuration. With a horizontal configuration, the strips of die-to-die interconnects 320 have die-to-die diffusion locations 326 that are perpendicular with columns of programmable logic blocks 328 (e.g., logic array blocks (LABs), configurable logic blocks (CLBs)) and routing circuitry 330 of the programmable logic circuitry 324. As a way of showing the modular, customizable nature of the integrated circuit system 102, the integrated circuit system 102 may have any suitable chiplets 232, such as a fabric chiplet 232*a* that couples to a transceiver (XCVR) chiplet 232*g*, two IO chiplets 232*c*, a memory chiplet 232*d*, an HPS chiplet 232*f*, and an SDM chiplet 232*h*.

In certain embodiments, a location for chiplet 232 placement may be decided based on the function of the integrated circuit system 102 and/or other chiplets 232 within the system 102. For example, the chiplet 232 may be configured implement functions of a high bandwidth transceiver and may be distanced from another similar chiplet 232 to evenly distribute bandwidth into the programmable logic circuitry 324. In another example, the IO chiplet 232*c* may be closely placed to the HPS chiplet 232*f* to facilitate a quick signal transfer. Additionally or alternatively, the location of the chiplets 232 may be altered by sliding the chiplets 232 up or down the interconnects 320. For example, the designer may determine that two chiplets 232 may be separated for more efficient operation.

In certain embodiments, the integrated circuit system 102 may include one or more Networks-on-Chip (NOCs) or NOC chiplets 232*m* to facilitate distribution of bandwidth into the fabric 224. For example, a NOC chiplet 232*m* may include microbumps 258 or hybrid bonds on a surface which may snap to the interconnects 320 of the substrate 234. One or more NOCs may be placed on a top and/or a bottom edge of any suitable chiplet 232 to help distribute bandwidth in the fabric 224 of a fabric chiplet 232*a*. Accordingly, a NOC chiplet may be mounted onto the fabric chiplet 232*a* in a 3D arrangement.

In certain embodiments, the integrated circuit system 102 may include an interposer between the substrate 234 and the chiplets 232. In general, any number of chiplets 232 may be mounted on the interposer and coupled to the substrate 234. Microbumps 258 or hybrid bonds may be formed at the top surface of the interposer to interface with the substrate 234 and the chiplets 232.

Figure 10:
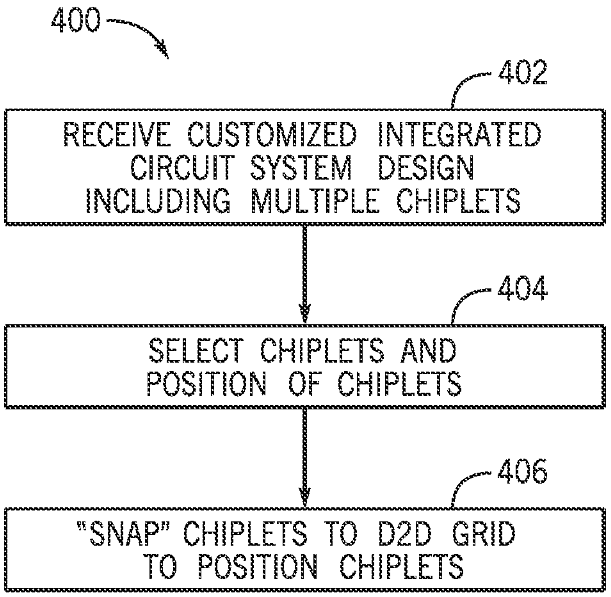
FIG. 10 is flowchart of a method of manufacturing the integrated circuit system, in accordance with an embodiment of the present disclosure.

As shown by a flowchart 400 of FIG. 10, an integrated circuit system 102 may be manufactured based on a custom design that may position chiplets along strips of die-to-die interconnects to facilitate highly customizable die-to-die communication. A manufacturer may receive a design for a customized integrated circuit system 102 from a customer (block 402). The design for the customized integrated circuit system 102 may be based on specifications particular to a user design (e.g., program 108, configuration bitstream) that is to be programmed into programmable logic fabric of the integrated circuit system 102. The manufacturer may assemble the customized integrated circuit system 102 using selected chiplets and any suitable positions along the strips of die-to-die interconnects (block 404). In one example, a customer may specify a type of function or a desired function and the manufacturer may select appropriate chiplets and/or their location. For example, the customer may provide certain specifications from the user design that is expected to be programmed into programmable logic fabric of the integrated circuit system. The specifications may include, for example, bandwidth, power, accelerator functions, and programmable logic fabric specifications. In another example, the customer may provide a design that specifies the particular placement of different chiplets in relation to one another. The customer may further select a size of the substrate 234 and sizes of the chiplets 232 to meet their specifications. In another example, the market may demand an integrated circuit system 102 with certain properties or functions to meet the specifications of certain high-performance applications. For example, the chiplets 232 may be arranged in a symmetrical manner for improved bandwidth distribution and/or thermal dissipation. The manufacturer may "snap" the chiplets 232 to suitable positions along the strips of the die-to-die interconnects to position the chiplets 232 in the integrated circuit system 102.

Figure 11:
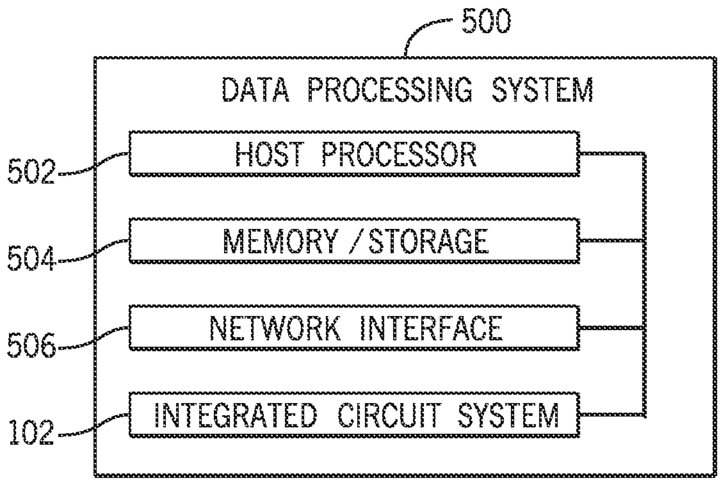
FIG. 11 is a block diagram of a data processing system including the integrated circuit system, in accordance with an embodiment of the present disclosure.

The integrated circuit system 102 may be a component included in a data processing system, such as a data processing system 500, shown in FIG. 11. The data processing system 500 may include the integrated circuit system 102 (e.g., a programmable logic device with chiplet packages), a host processor 502, memory and/or storage circuitry 504, and a network interface 506. The data processing system 500 may include more or fewer components (e.g., electronic display, user interface structures, application specific integrated circuits (ASICs)). Moreover, any of the circuit components depicted in FIG. 11 may include integrated circuit system 102. The host processor 502 may include any of the foregoing processors that may manage a data processing request for the data processing system 500 (e.g., to perform encryption, decryption, machine learning, video processing, voice recognition, image recognition, data compression, database search ranking, bioinformatics, network security pattern identification, spatial navigation, cryptocurrency operations, or the like). The memory and/or storage circuitry 504 may include random access memory (RAM), read-only memory (ROM), one or more hard drives, flash memory, or the like. The memory and/or storage circuitry 504 may hold data to be processed by the data processing system 500. In some cases, the memory and/or storage circuitry 504 may also store configuration programs (bitstreams) for programming the integrated circuit system 102. The network interface 506 may allow the data processing system 500 to communicate with other electronic devices. The data processing system 500 may include several different packages or may be contained within a single package on a single package substrate. For example, components of the data processing system 500 may be located on several different packages at one location (e.g., a data center) or multiple locations. For instance, components of the data processing system 500 may be located in separate geographic locations or areas, such as cities, states, or countries.

In one example, the data processing system 500 may be part of a data center that processes a variety of different requests. For instance, the data processing system 500 may receive a data processing request via the network interface 506 to perform encryption, decryption, machine learning, video processing, voice recognition, image recognition, data compression, database search ranking, bioinformatics, network security pattern identification, spatial navigation, digital signal processing, or some other specialized task.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS

EXAMPLE EMBODIMENT 1. An integrated circuit system in a package comprising:

a first chiplet comprising a grid-based interconnect field; and a second chiplet comprising a complementary grid-based interconnect field, wherein a plurality of interconnects of the complementary grid-based interconnect field of the second chiplet are connected to a corresponding plurality of interconnects of the grid-based interconnect field of the first chiplet.

EXAMPLE EMBODIMENT 2. The integrated circuit system of example embodiment 1, wherein the grid-based interconnect field comprises a repeating pattern of die-to-die interconnects.

EXAMPLE EMBODIMENT 3. The integrated circuit system of example embodiment 1, wherein the grid-based interconnect field of the first chiplet is arranged in separate regions of die-to-die interconnects.

EXAMPLE EMBODIMENT 4. The integrated circuit system of example embodiment 3, wherein the regions of die-to-die interconnects comprise strips of die-to-die interconnects.

EXAMPLE EMBODIMENT 5. The integrated circuit system of example embodiment 3, comprising a third chiplet comprising another complementary grid-based interconnect field, wherein a plurality of interconnects of the complementary grid-based interconnect field of the third chiplet are connected to a corresponding plurality of interconnects of the grid-based interconnect field of the first chiplet that are located in a different region of the die-to-die interconnects of the first chiplet than the plurality of interconnects of the grid-based interconnect field of the first chiplet that are connected to the second chiplet.

EXAMPLE EMBODIMENT 6. The integrated circuit system of example embodiment 1, wherein the plurality of interconnects of the complementary grid-based interconnect field of the second chiplet are connected to the corresponding plurality of interconnects of the grid-based interconnect field of the first chiplet via microbumps or hybrid bonds of a size smaller than C4 bumps.

EXAMPLE EMBODIMENT 7. The integrated circuit system of example embodiment 1, wherein the first chiplet comprises die-to-die driving circuits that connect to respective interconnects of the grid-based interconnect field.

EXAMPLE EMBODIMENT 8. The integrated circuit system of example embodiment 1, wherein the grid-based interconnect field of the first chiplet is larger than the complementary grid based field of the second chiplet, wherein there are unused interconnects of the grid-based interconnect field of the first chiplet that do not connect to interconnects of the complementary grid based field of the second chiplet.

EXAMPLE EMBODIMENT 9. The integrated circuit system of example embodiment 1, wherein the first chiplet comprises programmable logic blocks and programmable routing circuitry, wherein the programmable routing circuitry is configurable to route data to or from respective interconnects of the grid-based interconnect field of the first chiplet.

EXAMPLE EMBODIMENT 10. The integrated circuit system of example embodiment 1, comprising a third chiplet comprising another complementary grid-based interconnect field, wherein a plurality of interconnects of the complementary grid-based interconnect field of the third chiplet are connected to a corresponding plurality of interconnects of the grid-based interconnect field of the first chiplet.

EXAMPLE EMBODIMENT 11. An integrated circuit comprising:

a repeating pattern of die-to-die interconnects; and a repeating pattern of die-to-die driving circuitry to enable die-to-die communication with complementary patterns of die-to-die interconnects on another integrated circuit.

EXAMPLE EMBODIMENT 12. The integrated circuit of example embodiment 11, comprising programmable logic circuitry configurable to route data to or from selected interconnects of the repeating pattern of die-to-die interconnects.

EXAMPLE EMBODIMENT 13. The integrated circuit of example embodiment 12, wherein the programmable logic circuitry comprises programmable logic blocks configurable to operate on the data and programmable routing circuitry configurable to route the data to or from the programmable logic blocks and to or from the selected interconnects of the repeating pattern of die-to-die interconnects.

EXAMPLE EMBODIMENT 14. The integrated circuit of example embodiment 12, wherein the programmable logic circuitry comprises columns of programmable logic blocks and programmable routing circuitry and the repeating pattern of die-to-die interconnects comprises a column of die-to-die interconnects in parallel with the columns of programmable logic blocks and programmable routing circuitry.

EXAMPLE EMBODIMENT 15. The integrated circuit of example embodiment 12, wherein the programmable logic circuitry comprises columns of programmable logic blocks and programmable routing circuitry and the repeating pattern of die-to-die interconnects comprises a row of die-to-die interconnects perpendicular to the columns of programmable logic blocks and programmable routing circuitry.

EXAMPLE EMBODIMENT 16. The integrated circuit of example embodiment 11, wherein the repeating pattern of die-to-die interconnects comprises a plurality of separate regions of die-to-die interconnects.

EXAMPLE EMBODIMENT 17. The integrated circuit of example embodiment 11, comprising a repeating pattern of die-to-die driving circuitry connected to respective interconnects of the repeating pattern of die-to-die interconnects.

EXAMPLE EMBODIMENT 18. The integrated circuit of example embodiment 11, wherein the repeating pattern of die-to-die interconnects comprises circuitry to uniformly perform die-to-die communication across the repeating pattern.

EXAMPLE EMBODIMENT 19. A method comprising:

receiving a custom integrated circuit system design comprising a first integrated circuit die and a second integrated circuit die, wherein the first integrated circuit die has a first set of die-to-die interconnects, wherein the second integrated circuit die has a second set of die-to-die interconnects that are fewer in number than the first set of die-to-die interconnects, and wherein the first set of die-to-die interconnects is configurable to receive the second set of die-to-die interconnects on multiple possible subsets of the first set of die-to-die interconnects; and assembling the integrated circuit system at least in part by connecting the second set of die-to-die interconnects to one of the multiple possible subsets of the first set of die-to-die interconnects.

EXAMPLE EMBODIMENT 20. The method of example embodiment 19, wherein the second set of die-to-die interconnects is connected to the one of the multiple possible subsets of the first set of die-to-die interconnects using microbumps or hybrid bonds.

EXAMPLE EMBODIMENT 21. The method of example embodiment 19, wherein:

the custom integrated circuit system design comprises a third integrated circuit die;

the third integrated circuit die has a third set of die-to-die interconnects that are fewer in number than the first set of die-to-die interconnects;

the first set of die-to-die interconnects is configurable to receive the third set of die-to-die interconnects on multiple possible subsets of the first set of die-to-die interconnects; and the integrated circuit system is assembled at least in part by connecting the third set of die-to-die interconnects to a different one of the multiple possible subsets of the first set of die-to-die interconnects.

EXAMPLE EMBODIMENT 22. An integrated circuit system in a package comprising:

a first programmable logic fabric die comprising programmable logic circuitry; and a plurality of chiplets comprising disaggregated field programmable gate array (FPGA) circuitry, wherein the plurality of chiplets are connected to the first programmable logic fabric die in a three-dimensional arrangement.

EXAMPLE EMBODIMENT 23. The integrated circuit system of example embodiment 22, wherein the first programmable logic fabric die lacks the disaggregated FPGA circuitry provided by the plurality of chiplets.

EXAMPLE EMBODIMENT 24. The integrated circuit system of example embodiment 22, wherein the first programmable logic fabric die only includes programmable logic blocks, programmable routing circuitry, and die-to-die input/output (IO) circuitry.

EXAMPLE EMBODIMENT 25. The integrated circuit system of example embodiment 22, wherein the plurality of chiplets comprise disaggregated FPGA circuitry comprising FPGA memory, FPGA digital signal processor (DSP) blocks, FPGA input/output (IO) circuitry, or an FPGA hard processor system (HPS).

EXAMPLE EMBODIMENT 26. The integrated circuit system of example embodiment 22, wherein at least one of the plurality of chiplets comprises only one of the following types of FPGA circuitry: FPGA memory, FPGA digital signal processor (DSP) blocks, FPGA input/output (IO) circuitry, or an FPGA hard processor system (HPS).

EXAMPLE EMBODIMENT 27. The integrated circuit system of example embodiment 22, wherein at least one of the plurality of chiplets comprises a combination of at least two of the following types of FPGA circuitry: FPGA memory, FPGA digital signal processor (DSP) blocks, FPGA input/output (IO) circuitry, or an FPGA hard processor system (HPS).

EXAMPLE EMBODIMENT 28. The integrated circuit system of example embodiment 22, comprising an additional chiplet connected to the first programmable logic fabric die in a three-dimensional arrangement, wherein the additional chiplet comprises circuitry other than disaggregated FPGA circuitry.

EXAMPLE EMBODIMENT 29. The integrated circuit system of example embodiment 22, comprising a substrate upon which the first programmable logic fabric die is disposed, wherein the plurality of chiplets are disposed above the first programmable logic fabric die in a three-dimensional arrangement.

EXAMPLE EMBODIMENT 30. The integrated circuit system of example embodiment 22, comprising a substrate upon which at least one of the plurality of chiplets is disposed, wherein the first programmable logic fabric die is disposed above the at least one of the plurality of chiplets disposed on the substrate.

EXAMPLE EMBODIMENT 31. The integrated circuit system of example embodiment 22, comprising a second programmable logic fabric die.

EXAMPLE EMBODIMENT 32. The integrated circuit system of example embodiment 31, comprising a bridge, wherein the first programmable logic fabric die and the second programmable logic fabric die are in a 2.5D arrangement with respect to one another and in communication with one another via the bridge.

EXAMPLE EMBODIMENT 33. The integrated circuit system of example embodiment 31, wherein the first programmable logic fabric die and the second programmable logic fabric die are connected to one another in a three-dimensional arrangement.

EXAMPLE EMBODIMENT 34. The integrated circuit system of example embodiment 31, wherein the first programmable logic fabric die and the second programmable logic fabric die are of different sizes.

EXAMPLE EMBODIMENT 35. One or more tangible, non-transitory, machine-readable media comprising instructions that, when executed by a processor, cause the processor to perform the following operations:

analyze a user design to be programmed into programmable logic fabric of an integrated circuit system to determine resources of the integrated circuit system used by the user design;

select a plurality of chiplets that collectively comprise the resources used by the user design; and generate a design of the integrated circuit system comprising the selected plurality of chiplets.

EXAMPLE EMBODIMENT 36. The one or more tangible, non-transitory, machine-readable media of example embodiment 35, wherein the instructions to generate the design of the integrated circuit system comprise instructions to position the selected plurality of chiplets relative to one another.

EXAMPLE EMBODIMENT 37. The one or more tangible, non-transitory, machine-readable media of example embodiment 36, wherein the instructions to position the selected plurality of chiplets relative to one another comprise instructions to position the selected plurality of chiplets relative to one another based on a spatial positioning of the user design on the programmable logic fabric of the integrated circuit system.

EXAMPLE EMBODIMENT 38. The one or more tangible, non-transitory, machine-readable media of example embodiment 36, wherein the instructions to position the selected plurality of chiplets relative to one another comprise instructions to position the selected plurality of chiplets relative to one another based on a thermal profile of the user design on the integrated circuit system.

EXAMPLE EMBODIMENT 39. The one or more tangible, non-transitory, machine-readable media of example embodiment 36, wherein the instructions to position the selected plurality of chiplets relative to one another comprise instructions to position the selected plurality of chiplets relative to one another based on bandwidth constraints of the user design on the integrated circuit system.

EXAMPLE EMBODIMENT 40. A method comprising:

receiving a custom integrated circuit system design comprising a plurality of chiplets that include a first chiplet comprising programmable logic fabric circuitry and a second chiplet and a third chiplet respectively comprising circuitry to support the programmable logic fabric; and assembling the integrated circuit system using the first chiplet, second chiplet, and third chiplet at least in part by connecting the second chiplet and the third chiplet to the first chiplet in a three-dimensional arrangement.

EXAMPLE EMBODIMENT 41. The method of example embodiment 40, wherein the second chiplet and third chiplet comprise at least one of: additional programmable logic fabric circuitry, digital signal processing (DSP) circuitry, IO circuitry, memory circuitry, hard processor system (HPS) circuitry, transceiver circuitry, encryption or decryption circuitry, a device controller, a voltage regulator, an artificial intelligence (AI) engine, or a network on chip (NOC).

What is claimed is:

1. An integrated circuit system in a package comprising:
a first chiplet comprising a grid-based interconnect field, and
a second chiplet comprising a complementary grid-based interconnect field, wherein a plurality of interconnects of the complementary grid-based interconnect field of the second chiplet are connected to a corresponding plurality of interconnects of the grid-based interconnect field of the first chiplet.

2. The integrated circuit system of claim 1, wherein the grid-based interconnect field comprises a repeating pattern of die-to-die interconnects.

3. The integrated circuit system of claim 1, wherein the grid-based interconnect field of the first chiplet is arranged in separate regions of die-to-die interconnects.

4. The integrated circuit system of claim 3, wherein the regions of die-to-die interconnects comprise strips of die-to-die interconnects.

5. The integrated circuit system of claim 3, comprising a third chiplet comprising another complementary grid-based interconnect field, wherein a plurality of interconnects of the complementary grid-based interconnect field of the third chiplet are connected to a corresponding plurality of interconnects of the grid-based interconnect field of the first chiplet that are located in a different region of the die-to-die interconnects of the first chiplet than the plurality of interconnects of the grid-based interconnect field of the first chiplet that are connected to the second chiplet.

6. The integrated circuit system of claim 1, wherein the plurality of interconnects of the complementary grid-based interconnect field of the second chiplet are connected to the corresponding plurality of interconnects of the grid-based interconnect field of the first chiplet via microbumps or hybrid bonds of a size smaller than C4 bumps.

7. The integrated circuit system of claim 1, wherein the first chiplet comprises die-to-die driving circuits that connect to respective interconnects of the grid-based interconnect field.

8. The integrated circuit system of claim 1, wherein the grid-based interconnect field of the first chiplet is larger than the complementary grid-based field of the second chiplet, wherein there are unused interconnects of the grid-based interconnect field of the first chiplet that do not connect to interconnects of the complementary grid-based field of the second chiplet.

9. The integrated circuit system of claim 1, wherein the first chiplet comprises programmable logic blocks and programmable routing circuitry, wherein the programmable routing circuitry is configurable to route data to or from respective interconnects of the grid-based interconnect field of the first chiplet.

10. The integrated circuit system of claim 1, comprising a third chiplet comprising another complementary grid-based interconnect field, wherein a plurality of interconnects of the complementary grid-based interconnect field of the third chiplet are connected to a corresponding plurality of interconnects of the grid-based interconnect field of the first chiplet.

11. An integrated circuit comprising:
a first chiplet comprising:
a grid-based interconnect field that comprises a repeating pattern of die-to-die interconnects; and
a repeating pattern of die-to-die driving circuitry to enable die-to-die communication with complementary patterns of die-to-die interconnects on another integrated circuit; and
a second chiplet comprising a complementary grid-based interconnect field, wherein a plurality of interconnects of the complementary grid-based interconnect field of the second chiplet are connected to a corresponding plurality of interconnects of the grid-based interconnect field of the first chiplet.

12. The integrated circuit of claim 11, comprising programmable logic circuitry configurable to route data to or from selected interconnects of the repeating pattern of die-to-die interconnects.

13. The integrated circuit of claim 12, wherein the programmable logic circuitry comprises programmable logic blocks configurable to operate on the data and programmable routing circuitry configurable to route the data to or from the programmable logic blocks and to or from the selected interconnects of the repeating pattern of die-to-die interconnects.

14. The integrated circuit of claim 12, wherein the programmable logic circuitry comprises columns of programmable logic blocks and programmable routing circuitry and the repeating pattern of die-to-die interconnects comprises a column of die-to-die interconnects in parallel with the columns of programmable logic blocks and programmable routing circuitry.

15. The integrated circuit of claim 12, wherein the programmable logic circuitry comprises columns of programmable logic blocks and programmable routing circuitry and the repeating pattern of die-to-die interconnects comprises a row of die-to-die interconnects perpendicular to the columns of programmable logic blocks and programmable routing circuitry.

16. The integrated circuit of claim 11, wherein the repeating pattern of die-to-die interconnects comprises a plurality of separate regions of die-to-die interconnects.

17. The integrated circuit of claim 11, wherein the repeating pattern of die-to-die interconnects comprises circuitry to uniformly perform die-to-die communication across the repeating pattern.

18. A method comprising:
receiving a custom integrated circuit system design comprising a first integrated circuit die and a second integrated circuit die, wherein the first integrated circuit die has a first set of die-to-die interconnects, wherein the second integrated circuit die has a second set of die-to-die interconnects that are fewer in number than the first set of die-to-die interconnects, and wherein the first set of die-to-die interconnects is configurable to receive the second set of die-to-die interconnects on multiple possible subsets of the first set of die-to-die interconnects; and
assembling the custom integrated circuit system design at least in part by connecting the second set of die-to-die interconnects to one of the multiple possible subsets of the first set of die-to-die interconnects, wherein the second set of die-to-die interconnects is complementary to the first set of die-to-die interconnects.

19. The method of claim 18, wherein the second set of die-to-die interconnects is connected to the one of the multiple possible subsets of the first set of die-to-die interconnects using microbumps or hybrid bonds.

20. The method of claim 18, wherein:

the custom integrated circuit system design comprises a third integrated circuit die;

the third integrated circuit die has a third set of die-to-die interconnects that are fewer in number than the first set of die-to-die interconnects;

the first set of die-to-die interconnects is configurable to receive the third set of die-to-die interconnects on multiple possible subsets of the first set of die-to-die interconnects; and the custom integrated circuit system design is assembled at least in part by connecting the third set of die-to-die interconnects to a different one of the multiple possible subsets of the first set of die-to-die interconnects.

21. The integrated circuit system of claim 1, wherein the connection between the complementary grid-based interconnect field and the grid-based interconnect field is based at least in part on a custom integrated circuit system design, and the complementary grid-based interconnect field has fewer interconnects than the grid-based interconnect field.

* * * * *